United States Patent
Kononchuk et al.

(10) Patent No.: US 8,148,242 B2
(45) Date of Patent: Apr. 3, 2012

(54) OXIDATION AFTER OXIDE DISSOLUTION

(75) Inventors: Oleg Kononchuk, Theys (FR); George K. Celler, Summit, NJ (US)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 12/811,210

(22) PCT Filed: Feb. 20, 2008

(86) PCT No.: PCT/IB2008/051801
§ 371 (c)(1),
(2), (4) Date: Jun. 29, 2010

(87) PCT Pub. No.: WO2009/104060
PCT Pub. Date: Aug. 27, 2009

(65) Prior Publication Data
US 2010/0283118 A1    Nov. 11, 2010

(51) Int. Cl.
*H01L 21/477*   (2006.01)

(52) U.S. Cl. .... 438/479; 438/770; 438/762; 257/E21.46

(58) Field of Classification Search .................. 257/506, 257/E21.46; 438/479, 770, 762
See application file for complete search history.

(56) References Cited

U.S. PATENT DOCUMENTS

| | | | | |
|---|---|---|---|---|
| 6,465,317 B2 * | 10/2002 | Marty | | 438/321 |
| 2005/0118789 A1 * | 6/2005 | Aga et al. | | 438/459 |
| 2006/0051945 A1 | 3/2006 | Yokokawa et al. | | 438/526 |
| 2006/0154442 A1 | 7/2006 | de Souza et al. | | 438/455 |
| 2007/0069283 A1 | 3/2007 | Shih et al. | | 257/324 |
| 2007/0080423 A1 * | 4/2007 | Tsuboi et al. | | 257/506 |
| 2007/0173033 A1 * | 7/2007 | Allibert et al. | | 438/455 |
| 2007/0246754 A1 * | 10/2007 | Sonsky et al. | | 257/288 |
| 2011/0140230 A1 * | 6/2011 | Daval et al. | | 257/506 |

FOREIGN PATENT DOCUMENTS

EP    1 596 437    11/2005

OTHER PUBLICATIONS

Green, et al., "Ultrathin (4nm) SiO2 and Si-O-N gate Dielectric Layers for Silicon Microelectronics: Understanding The Processing, Structure and Physical and Electrical Limits", Journal of Applied Physics, vol. 90, No. 5, pp. 2001-2121 2086 (2001).*
International Search Report, PCT/IB2008/051801, mailed Dec. 30, 2008.

* cited by examiner

*Primary Examiner* — Matthew Landau
*Assistant Examiner* — Robert Bachner
(74) *Attorney, Agent, or Firm* — Winston & Strawn LLP

(57) ABSTRACT

A method for manufacturing a SeOI substrate that includes a thin working layer made from one or more semiconductor material(s); a support layer; and a thin buried oxide layer between the working layer and the support layer. The method includes a manufacturing step of an intermediate SeOI substrate having a buried oxide layer with a thickness greater than a thickness desired for the thin buried oxide layer; and a dissolution step of the buried oxide layer in order to form therewith the thin buried oxide layer. After the dissolution step, an oxidation step of the substrate is conducted for creating an oxidized layer on the substrate, and an oxide migration step for diffusing at least a part of the oxide layer through the working layer in order to increase the electrical interface quality of the substrate and decrease its Dit value.

20 Claims, 2 Drawing Sheets

| Top Si thickness after anneal [Å] | Anneal time [min] | Max rate of BOX dissolution [Å/sec] | Dit x$10^{11}$ [cm$^{-2}$ eV$^{-1}$] | Dit control x$10^{11}$ [cm$^{-2}$ eV$^{-1}$] | μe [cm$^2$/Vs] | μe control [cm$^2$/Vs] | μh [cm$^2$/Vs] | μh control [cm$^2$/Vs] |
|---|---|---|---|---|---|---|---|---|
| 2300 | 5 | 0.01 | 2 | 2.5 | 692 | 750 | 202 | 200 |
| 2250 | 40 | 0.01 | 2.4 | 2.5 | 661 | 750 | 195 | 200 |
| 550 | 40 | 0.06 | 8.3 | 6 | 414 | 520 | 116 | 140 |
| 400 | 60 | 0.08 | 35 | 8.5 | 170 | 400 | 55 | 110 |
| 310 | 6 | 0.1 | - | 10 | - | 350 | - | 90 |

Prior to dissolution treatment     After dissolution treatment

Oxidation treatment

RTO-type treatment

Oxide deposition

OXIDATION AFTER OXIDE DISSOLUTION

This application is a 371 filing of International Patent Application PCT/IB2008/051801 filed Feb. 20, 2008.

BACKGROUND

The invention relates to a method for manufacturing a SeOI substrate (Semiconductor On Insulator) with a thin buried oxide and with a low Dit value, said substrate comprising:
- a thin working layer made from one or more semiconductor material(s);
- a support layer; and
- a thin oxide layer between the working layer and the support layer; said method comprising:
- a manufacturing step of an intermediate SeOI substrate having a buried oxide layer with a thickness greater than a thickness desired for said thin buried oxide layer;
- a dissolution step of said buried oxide layer in order to form therewith said thin buried oxide layer.

The invention applies more particularly to the manufacturing of SeOI substrates with a UTBOX (Ultra Thin Buried Oxide) layer. And more generally UTBOX substrates represent a particularly advantageous application of the invention.

The invention also concerns a SeOI substrate, especially a SeOI substrate with a thin buried oxide, having a good interface quality determined by a low value of Dit.

The invention concerns in particular SeOI substrates with a thin buried oxide that have undergone an oxide dissolution treatment. The invention also concerns a method for improving the interface quality of such SeOI substrates.

A SeOI substrate is understood in this text as a substrate comprising:
- a thin working layer made from one or more semiconductor material(s), such as silicon,
- a support layer, and
- a buried oxide (BOX) layer between the working layer and the support layer.

In this text, a thin buried oxide layer is understood as a BOX layer having a thickness which is less than 100 nm.

Also, in this text, an ultra thin buried oxide (UTBOX) layer is understood as a BOX layer having a thickness which is less than 50 nm. A UTBOX layer is therefore a thin BOX of a specific type. A SeOI substrate with a thin buried oxide is understood in this text as a SeOI substrate comprising an ultra thin buried oxide layer.

A Dit value of a SeOI substrate with a thin buried oxide is representative of the electrical quality of the substrate. The Dit is related to the interface trap density. It characterizes the interface between the working layer and the buried oxide layer of the SeOI. In this text "interface quality" of a SeOI substrate shall mean the quality as characterized by the Dit, and/or the charge mobility, observed at or near the interface between the working layer and the BOX layer.

A known technique for manufacturing SeOI substrates with a thin buried oxide implies an oxide dissolution treatment of the BOX layer of a SeOI substrate. During such treatment, the dissolution, by diffusion, throughout the working layer can reach high rates, especially when the working layer of the SeOI is thin.

In this technique it can be desired to control the dissolution parameters (atmosphere, temperature, pressure . . . ) in order to accelerate the dissolution of the oxide. Such acceleration can also sometimes be the result of a somewhat uncontrolled dissolution.

Such accelerated dissolution is usually seen as an advantage, as it accelerates the process.

However, carrying out oxide dissolution too rapidly can lead to a SeOI substrate with interface defects, with high Dit values (higher than e.g. $1.10^{13}$ cm$^{-2}$eV$^{-1}$) because of a high dissolution rate.

Indeed, a drawback associated to dissolution rates which are too high is the generation of defects remaining at the interface between the working layer and the BOX. Such defects in turn generate a high Dit and a low charge mobility.

SUMMARY OF THE INVENTION

The present invention now provides a method for manufacturing SeOI substrates having a thin buried oxide with low Dit values and high charge mobility.

It is specified that in this text :
- a low Dit value means a Dit lower than $1.10^{12}$ cm$^{-2}$eV$^{-1}$;
- a high charge mobility means a charge mobility higher than 500 cm$^2$.Vs$^{-1}$.

Furthermore the invention aims at manufacturing such high quality SeOI substrates with thin buried oxide while having obtained them through a fast dissolution process.

Also, the invention aims at allowing restoring good Dit and charge mobility values for SeOI substrates with thin buried oxide which have undergone fast dissolution processes and subsequently contain interface defects which compromise low Dit values and high charge mobility.

To this end, the present invention provides a method for manufacturing a SeOI substrate with a thin buried oxide, said substrate comprising:
- a thin working layer made from one or more semiconductor material(s);
- a support layer; and
- a thin buried oxide layer between the working layer and the support layer;
said method comprising:
- a manufacturing step of an intermediate SeOI substrate having a buried oxide layer with a thickness greater than a thickness desired for said thin buried oxide layer;
- a dissolution step of said buried oxide layer in order to form therewith said thin buried oxide layer
characterized in that the method comprises after said dissolution step an oxidation step of said substrate for creating an oxidized layer on the substrate, and an oxide migration step for diffusing at least a part of said oxide layer through the working layer, in order to increase the electrical interface quality of said substrate and decrease its Dit value.

The invention also proposes a method for improving the interface quality of a SeOI substrate with a thin buried oxide layer, which has undergone an oxide dissolution treatment, characterized in that the method comprises an oxidation step of said substrate for creating an oxidized layer on the substrate, and an oxide migration step for diffusing at least a part of said oxide layer through the working layer, in order to increase the electrical interface quality of said substrate and decrease its Dit value.

Preferred but non limiting aspects of such methods are the following:
- during the oxidation step the oxidation temperature is comprised between 1100° C. and 1150° C.,
- said oxidation step is carried out for less than 30 minutes,
- said oxidation step is carried out for less than 2 minutes,
- the oxidation step is an oxide deposition treatment, which is carried out at a temperature below 900° C.,
- after the oxide deposition treatment, a heat treatment is carried out at a temperature comprising between 1100° C. and 1150° C., the oxide deposition treatment is a chemical vapour deposition treatment, a low pressure chemical vapour deposition treatment, an atomic layer deposition treatment, or a plasma enhanced chemical vapour deposition treatment, the oxide deposition treatment is a low pressure chemical vapour deposition treatment, wherein tetraethylorthosilicate is used as a precursor, a deoxidation step is carried out after the oxidation treatment, the working layer prior to the oxidation step is thinner than 55 nm, the dissolution step is mainly performed on local island(s) of the buried oxide layer.

The invention also proposes a SeOI manufactured using such a method, characterized in that its Dit value is lower than $1.10^{12}$ cm$^{-2}$eV$^{-1}$. Among others such SeOI has a charge mobility higher than 500 cm$^2$/Vs.

BRIEF DESCRIPTION OF THE DRAWINGS

Other features, objects and advantages of the invention shall be understood in greater detail in reading the following description, which is illustrated by the following figures.

DETAILED DESCRIPTION OF THE INVENTION

Figures 1, 2:
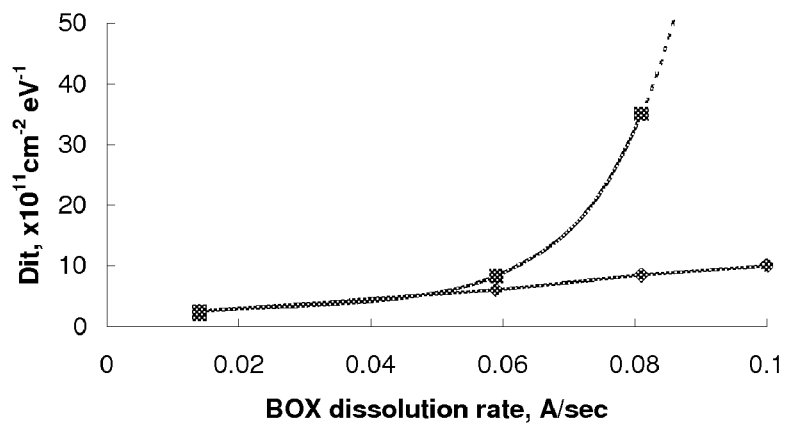
FIG. 1 is a table gathering electrical parameters extracted from Pseudo-MOSFET measurements, associated with SeOI having dissolution treatment under different conditions.
FIG. 2 is a graph showing the evolution of the Dit associated to a SeOI having undergone dissolution treatment, as a function of the BOX dissolution rate obtained during the dissolution treatment.

As mentioned above, during an oxide dissolution treatment, the thinner the working layer 11 is, the higher the dissolution rate is. FIG. 1 thus illustrates that for a SOI substrate 1 when the working layer 11 (here in silicon) is thinner than 55 nm, the dissolution rate becomes high (over 0.06 Å/sec).

FIG. 2 exhibits the fact that high Dit values can be due to a high dissolution rate.

In this figure:

square symbols refer to Dit measurements on SeOI samples having undergone oxide dissolution treatment and having Si working layers 11 of different thicknesses, and diamond symbols refer to Dit measurements on SeOI control sample with the same Si layer 11 thicknesses, but which have not undergone dissolution treatment.

This figure shows that SeOI samples that did not undergo an oxide dissolution treatment exhibit lower Dit values than those that did, when the working layer 11 thickness is sufficiently thin (thinner than 550 Å) to involve a dissolution rate above 0.06 Å.sec$^{-1}$. For a dissolution rate under 0.06 Å.sec$^{-1}$, the Dit values are similar for SeOI samples that did and did not undergo an oxide dissolution treatment.

Figure 3:
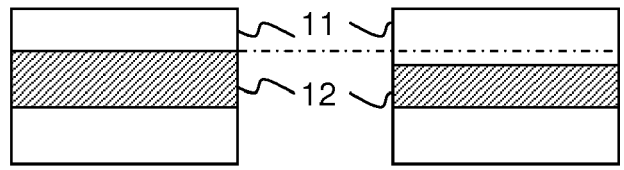
FIG. 3 shows schematically the evolution at the BOX interface during an oxide dissolution treatment.

As illustrated in FIG. 3, during the oxide dissolution treatment carried out ion a SeOI 1, the interface between the working layer 11 and the buried oxide layer 12 moves. This results in a thinning of the buried oxide layer 12.

In order to improve the Dit of SeOI substrates 1—especially SeOI substrates with thin buried oxide 12—having undergone an oxide dissolution the invention proposes to add after dissolution the following steps:

an oxidation step of said substrate for creating an oxidized layer 13 on the substrate, and an oxide migration step for diffusing at least a part of said oxide layer 13 through the working layer 11, thereby curing the interface between the working layer 11 and the BOX layer 12, in order to increase the electrical interface quality of said substrate and decrease its Dit value.

The oxidation treatment of the present invention is important because the oxide dissolution leads to deficiency of oxygen near the interface of the substrate with thin buried oxide, and therefore to high Dit values and low charge mobility.

The oxidation step and the oxide migration step are either successive or simultaneous.

In a first embodiment of the invention, an oxidation step is carried out in an oxidizing atmosphere at a temperature between 1100° C. and 1150° C. during 30 min maximum, preferably between 10 to 30 min.

Figure 4:
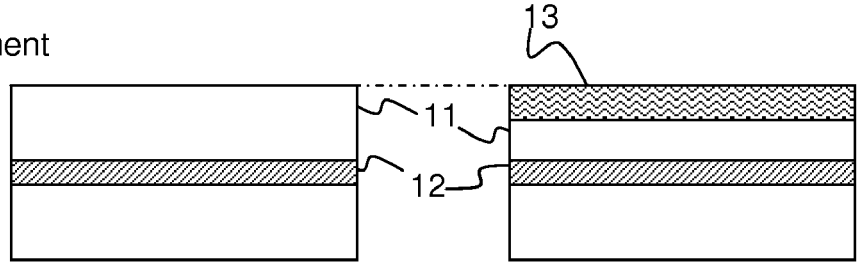
FIG. 4 shows schematically the results of an oxidation step according to the embodiments of the invention (thicknesses of different layers are not to scale).
Figure 4:
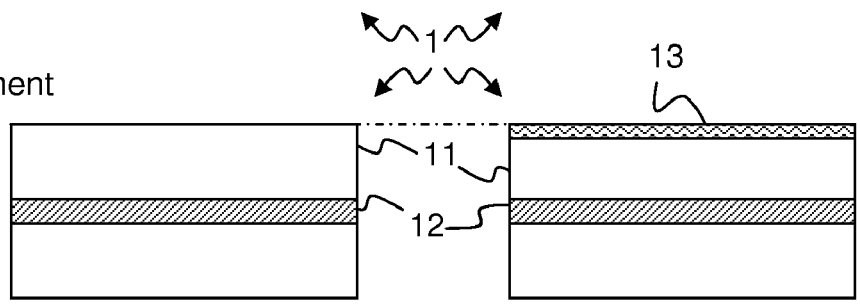
Figure 4:
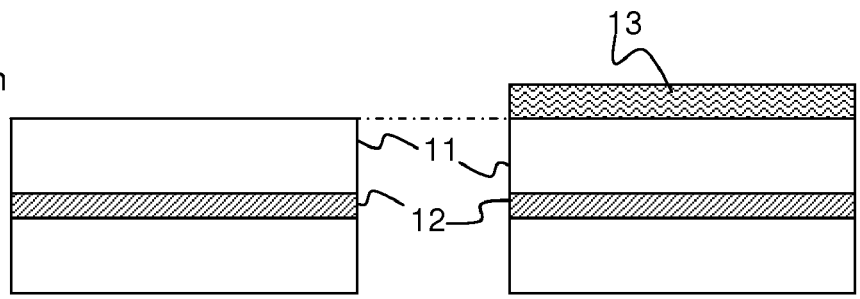

Such oxidation oxidizes an upper layer 13 of the working layer 11 of the SeOI as shown in FIG. 4. The thickness of the oxidized upper layer is in maximum about 70 nm.

The first embodiment of the invention is well suited for SeOI substrates with a working layer 11 which is thick enough for providing material to be oxidized and still offering some thickness in the SeOI working layer after oxidation. Typically, this first embodiment is well adapted to SeOI having a working layer which has an initial thickness lying between 70 nm and 120 nm.

The thickness of the oxidized layer 13 typically is under 70 nm.

According to a second embodiment of the invention, the oxidation step is a RTO-type treatment (Rapid Thermal Oxidation) under an oxidizing atmosphere with a ramp of increasing temperature around 5° C.min$^{-1}$. The temperature is preferably set between 1100° C. and 1150° C. The operating time is less than two minutes.

The RTO-type treatment results in an oxidation of an upper layer 13 of the working layer 11.

Because the oxidation time is shorter than in the first embodiment, the thickness of the oxidized upper layer 13 is less than 30 nm as schematically shown in FIG. 4.

The second embodiment of the invention is well suited for treating SeOI substrate with a working layer having an initial thickness which can be as small as 50 nm.

In a third embodiment of the invention, an oxide deposition treatment is carried out as the oxidation step at a temperature lower than 900° C. After the formation of the oxide layer 13, a heat treatment is performed at a temperature comprised between 1100° C. and 1150° C. during 10 to 30 min in an oxidizing atmosphere.

This oxide deposition treatment can be for example a chemical vapour deposition (CVD) treatment, a low pressure chemical vapour deposition (LPCVD), an atomic layer deposition (ALD), or a plasma enhanced chemical vapour deposition (PECVD).

For example, in the case where the oxide layer 12 is a silicon dioxide SiO$_2$ layer, a LPCVD can be carried out, using tetraethylorthosilicate (TEOS) as precursor. TEOS is introduces into the chemical vapour deposition reactor in a gaseous state. Temperature and pressure used result in a TEOS decomposition:

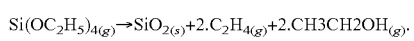

The silicon dioxide deposits onto the working layer 11.

This treatment leads to an oxide layer 13 deposition onto the working layer as shown in FIG. 4.

In all these embodiments, the oxidizing atmosphere is a pure oxygen atmosphere or an atmosphere of a mixture of oxygen and a neutral gas (for example argon).

In all embodiments, working at high temperatures (ranging from 1100° C. to 1150° C.) leads to oxygen migration (via diffusion) through the working layer 11 down to the interface between the working layer 11 and the buried oxide layer 12.

This leads to a curing of this interface and of the region between the working layer/BOX interface prior to oxide dissolution and after. Such curing eliminates "dangling bonds" and thereby reduces the amount of interface defects.

The high temperature is required to have enough energy for the curing of the interface and to reach an equilibrium at the interface. This equilibrium corresponds to a reduction in dangling bonds at the interface due to a molecular rearrangement after the treatment. These "dangling bonds" are a missing bond of an atom (here an atom of the material of the working layer) in the crystalline lattice. They are created at the BOX interface during the oxide dissolution treatment.

A curing of the interface is therefore equivalent to a filling in of oxide deficiencies.

The less the duration of the oxidation step is, the less the working layer is oxidized. The applied thermal parameters (duration and temperature) depend on the necessity of the interface curing but also of the thickness of the working layer which can be consumed during the oxidation step.

In the first and third embodiments of the invention, the oxidation treatment is followed by a deoxidation step of about 10 minutes. Such deoxidation step is carried out for example through an HF treatment. The deoxidation step is carried out for eliminating the oxide layer remaining on the UTBOX substrate 1 after the curing step is applied.

The invention is particularly well adapted for producing SeOI substrates 1 having an UTBOX layer 12 with low Dit value, meaning lower than $1.10^{12}$ $cm^{-2}eV^{-1}$. Indeed, the invention allows the manufacturing of SeOI substrates with a thin buried oxide but also a thin working layer, for which the oxide dissolution treatment does not lead to satisfactory results concerning the quality of the interface between the working layer 11 and the BOX layer.

The invention is also well adapted for producing SeOI substrates, which exhibit high charge mobility, that is to say higher than 500 $cm^2.Vs^{-1}$.

Finally the invention can be also applied to local oxide dissolution, where by appropriate masking at the surface, mainly local island(s) of buried layer is/are thinned down by the dissolution step. In this case, the product obtained after the dissolution step, is a patterned SeOI substrate.

What is claimed is:

1. A method for manufacturing a SeOI substrate having a thin working layer made from one or more semiconductor material(s), a support layer, and a thin buried oxide layer between the working layer and the support layer, wherein the method comprises:

manufacturing an intermediate SeOI substrate having an initial buried oxide layer with a thickness greater than a thickness desired for the final thin buried oxide layer;

dissolving part of the initial buried oxide layer in order to form therewith the final thin buried oxide layer;

oxidizing the substrate to create a surface oxidized layer thereon;

diffusing at least a part of the oxide layer through the surface semiconductor working layer by oxide migration in an amount sufficient to increase the electrical interface quality of substrate and decrease its Dit value at the interface between the semiconductor working layer and the buried oxide layer.

2. The method of claim 1, wherein the oxidizing is conducted at a temperature of between 1100° C. and 1150° C. for less than 30 minutes.

3. The method of claim 1, wherein the oxidizing comprises an oxide deposition treatment carried out at a temperature below 900° C.

4. The method of claim 3, wherein after the oxide deposition treatment, a heat treatment is carried out at a temperature between 1100° C. and 1150° C.

5. The method of claim 3, wherein the oxide deposition treatment is a chemical vapor deposition treatment, a low pressure chemical vapor deposition treatment, an atomic layer deposition treatment, or a plasma enhanced chemical vapor deposition treatment.

6. The method of claim 3, wherein the oxide deposition treatment is a low pressure chemical vapor deposition treatment, wherein tetraethylorthosilicate is used as a precursor.

7. The method of claim 3, which further comprises deoxidizing the substrate after the oxide deposition treatment.

8. The method of claim 3, wherein the working layer prior to the oxidation oxide deposition treatment is thinner than 55 nm.

9. The method of claim 4, wherein the dissolving of the surface oxide layer is mainly performed on one or more local island(s) of the buried oxide layer due to masking of the substrate surface and at a dissolution rate of above 0.06/sec.

10. A method for improving the interface quality of a SeOI substrate having a thin buried oxide layer, wherein the substrate has undergone an oxide dissolution treatment, which comprises:

oxidizing the SeOI substrate to create a surface oxidized layer thereon;

diffusing at least a part of the oxide layer through the surface semiconductor working layer by oxide migration in an amount sufficient to increase the electrical interface quality of the substrate and decrease its Dit value at the interface between the semiconductor working layer and the buried oxide layer.

11. The method of claim 10, wherein the oxidizing is conducted at a temperature of between 1100° C. and 1150° C. for less than 30 minutes.

12. The method of claim 10, wherein the oxidizing comprises an oxide deposition treatment carried out at a temperature below 900° C.

13. The method of claim 12, wherein after the oxide deposition treatment, a heat treatment is carried out at a temperature between 1100 ° C. and 1150° C.

14. The method of claim 12, wherein the oxide deposition treatment is a chemical vapor deposition treatment, a low pressure chemical vapor deposition treatment, an atomic layer deposition treatment, or a plasma enhanced chemical vapor deposition treatment.

15. The method of claim 12, wherein the oxide deposition treatment is a low pressure chemical vapor deposition treatment, wherein tetraethylorthosilicate is used as a precursor.

16. The method of claim 12, which further comprises deoxidizing the substrate after the oxide deposition treatment.

17. The method of claim 12, wherein the working layer prior to the oxide deposition treatment is thinner than 55 nm.

18. The method of claim 12, wherein the dissolving of the surface oxide layer is mainly performed on one or more local island(s) of the buried oxide layer due to masking of the substrate surface and at a dissolution rate of above 0.06/sec.

19. A method for manufacturing a SeOI substrate having a thin working layer made from one or more semiconductor material(s), a support layer, and a thin buried oxide layer between the working layer and the support layer, wherein the method comprises:
  oxidizing the SeOI substrate to create a surface oxidized layer thereon; and
  diffusing at least a part of the surface oxide layer through the semiconductor working layer by oxide migration in an amount sufficient to provide an SeOI substrate having a Dit value that is lower than $1\times10^{12}$ $cm^{-2}eV^{-1}$ and a charge mobility that is higher than 500 $cm^2$/Vsec.

20. The method of claim 19, wherein the SeOI substrate is provided by:
  manufacturing an intermediate SeOI substrate having an initial buried oxide layer with a thickness greater than a thickness desired for the final thin buried oxide layer; and
  dissolving part of the initial buried oxide layer in order to form therewith the final thin buried oxide layer.

* * * * *

UNITED STATES PATENT AND TRADEMARK OFFICE
CERTIFICATE OF CORRECTION

PATENT NO. : 8,148,242 B2  
APPLICATION NO. : 12/811210  
DATED : April 3, 2012  
INVENTOR(S) : Kononchuk et al.

Page 1 of 1

It is certified that error appears in the above-identified patent and that said Letters Patent is hereby corrected as shown below:

Column 6:
Line 24 (claim 8, line 2), delete "oxidation"

Signed and Sealed this
Eighth Day of May, 2012

David J. Kappos
*Director of the United States Patent and Trademark Office*